United States Patent
Chen

(10) Patent No.: US 12,477,832 B2
(45) Date of Patent: Nov. 18, 2025

(54) SEMICONDUCTOR DEVICE AND SEMICONDUCTOR STRUCTURE FOR ELECTROSTATIC PROTECTION

(71) Applicant: Nuvoton Technology Corporation, Hsinchu Science Park (TW)

(72) Inventor: Yi-Hao Chen, Taichung (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 544 days.

(21) Appl. No.: 17/189,519

(22) Filed: Mar. 2, 2021

(65) Prior Publication Data
US 2021/0305233 A1   Sep. 30, 2021

(30) Foreign Application Priority Data

Mar. 31, 2020  (TW) ................................ 10911093.8

(51) Int. Cl.
*H10D 89/60*  (2025.01)
*H02H 9/04*  (2006.01)

(52) U.S. Cl.
CPC ............ *H10D 89/60* (2025.01); *H02H 9/046* (2013.01)

(58) Field of Classification Search
CPC .............. H01L 27/0248; H01L 27/027; H01L 27/0296; H01L 27/0266; H01L 27/0292; H02H 9/046
See application file for complete search history.

(56) References Cited

U.S. PATENT DOCUMENTS

| | | | | |
|---|---|---|---|---|
| 5,519,243 A * | 5/1996 | Kikuda | ................. | H01L 27/105 257/532 |
| 6,031,405 A * | 2/2000 | Yu | ........................ | H10D 89/713 327/439 |
| 6,207,998 B1 * | 3/2001 | Kawasaki | ........... | G11C 11/4097 257/532 |
| 6,479,883 B1 * | 11/2002 | Chen | ................... | H01L 27/0266 257/357 |
| 7,233,475 B1 * | 6/2007 | Chen | ................... | H10D 89/811 361/111 |

(Continued)

FOREIGN PATENT DOCUMENTS

| | | |
|---|---|---|
| CN | 110911397 A | 3/2020 |
| TW | 200524134 A | 7/2005 |
| TW | 201620136 A | 6/2016 |

OTHER PUBLICATIONS

Office Action and Search Report issued in corresponding TW application No. 109110938 on Sep. 16, 2020 (4 pages).

*Primary Examiner* — Teresa M. Arroyo
(74) *Attorney, Agent, or Firm* — MUNCY, GEISSLER, OLDS & LOWE, P.C.

(57) ABSTRACT

A semiconductor device for protecting an internal circuit includes a transistor, a first doping region, and a second doping region. The transistor includes a gate terminal, a source terminal, and a drain terminal. The gate terminal is coupled to a ground. The source terminal is coupled to the internal circuit. The drain terminal is coupled to an input/output pad. The first doping region has a first conductive type. The second doping region has a second conductive type and is adjacent to the first doping region. The first doping region and the second doping region form the gate terminal. The first conductive type is different from the second conductive type.

20 Claims, 12 Drawing Sheets

(56) References Cited

U.S. PATENT DOCUMENTS

| | | | |
|---|---|---|---|
| 2001/0012189 A1* | 8/2001 | Tang | H10D 89/611 |
| | | | 361/56 |
| 2002/0154462 A1* | 10/2002 | Ker | H01L 27/0255 |
| | | | 361/56 |
| 2003/0173638 A1* | 9/2003 | Hayashi | H01L 27/0928 |
| | | | 257/500 |
| 2005/0145945 A1* | 7/2005 | Zdebel et al. | H01L 23/62 |
| | | | 257/355 |
| 2006/0131693 A1* | 6/2006 | Kim | H01L 27/0623 |
| | | | 257/565 |
| 2009/0097177 A1* | 4/2009 | Mori | H01L 27/0251 |
| | | | 257/360 |
| 2011/0079818 A1* | 4/2011 | Morishita | H10D 89/713 |
| | | | 257/E29.166 |
| 2013/0170082 A1* | 7/2013 | Yeh | H02H 9/046 |
| | | | 361/56 |
| 2014/0159206 A1* | 6/2014 | Hsu | H01L 21/265 |
| | | | 438/514 |
| 2014/0167159 A1* | 6/2014 | Takeda et al. | H01L 29/78 |
| 2016/0372456 A1* | 12/2016 | Yoo | H01L 27/027 |
| 2017/0077083 A1 | 3/2017 | Fujiwara et al. | |
| 2018/0287378 A1* | 10/2018 | Sithanandam | H02H 9/04 |
| 2019/0043854 A1* | 2/2019 | Appaswamy | H01L 27/0259 |
| 2020/0091137 A1* | 3/2020 | Tai | H01L 29/0692 |

\* cited by examiner

SEMICONDUCTOR DEVICE AND SEMICONDUCTOR STRUCTURE FOR ELECTROSTATIC PROTECTION

CROSS REFERENCE TO RELATED APPLICATIONS

This Application claims priority of Taiwan Patent Application No. 109110938, filed on Mar. 31, 2020, the entirety of which is incorporated by reference herein.

BACKGROUND OF THE INVENTION

Field of the Invention

The disclosure relates generally to a semiconductor device and a semiconductor structure and more specifically it relates a semiconductor device and a semiconductor structure for electrostatic protection.

Description of the Related Art

Integrated circuits can be seriously damaged by any kind of electrostatic discharge. The most common cause of electrostatic discharge is the human body, and as such, it is known as the Human Body Model (HBM). Several amperes of peak current can be generated by the human body in about 100 nanoseconds, and this can flow to an integrated circuit, which can damage the integrated circuit. The second most common cause of electrostatic discharge consists of metal objects, and this is known as the Machine Model (MM). Current generated in the Machine Model has a shorter rise time and a higher current level than that in the Human Body Model. The third mechanism is the Charged-Device Model (CDM), in which an accumulated charge in the integrated circuit is discharged to ground in less than 0.5 nanoseconds of rise time. Therefore, an effective ESD protection device is required to prevent the integrated circuit from experiencing damage caused by ESD.

BRIEF SUMMARY OF THE INVENTION

In an embodiment, a semiconductor device for protecting an internal circuit comprises a transistor, a first doping region, and a second doping region. The transistor comprises a gate terminal, a source terminal, and a drain terminal. The gate terminal is coupled to a ground, the source terminal is coupled to the internal circuit, and the drain terminal is coupled to an input/output pad. The first doping region has a first conductive type. The second doping region has a second conductive type. The first doping region is adjacent to the second doping region. The first doping region and the second doping region form the gate terminal. The first conductive type is different from the second conductive type.

According to an embodiment of the invention, the semiconductor device further comprises a first semiconductor substrate, a first well, a second well, a third well, and a fourth well. The first semiconductor substrate has the first conductive type. The first well has the second conductive type and is formed in the semiconductor substrate. The second well has the second conductive type and is formed in the first well. The third well has the first conductive type, is formed in the semiconductor substrate, and is adjacent to the first well. The fourth well has the first conductive type, is formed in the first well, and is disposed between the second well and the third well. The first doping region and the second doping region are formed in the fourth well.

According to an embodiment of the invention, the semiconductor device further comprises a third doping region, a fourth doping region, and a fifth doping region. The third doping region has the second conductive type and is formed in the second well. The fourth doping region has the second conductive type, is formed in the first well, and is disposed between the third well and the fourth well. The fifth doping region has the first conductive type and is formed in the third well.

According to an embodiment of the invention, the first doping region is disposed between the second doping region and the third doping region.

According to an embodiment of the invention, the second doping region is disposed between the first doping region and the third doping region.

According to an embodiment of the invention, the second doping region is divided into a plurality of blocks, wherein the blocks are evenly distributed in the first doping region.

According to another embodiment of the invention, the first doping region is divided into a plurality of blocks, wherein the blocks are evenly distributed in the second doping region.

According to an embodiment of the invention, the third doping region forms the drain terminal, the fourth doping region forms the source terminal, and the fifth doping region forms a base terminal of the transistor, wherein the base terminal is coupled to the ground.

According to an embodiment of the invention, the semiconductor device further comprises a first top doping region and a second top doping region. The first top doping region has the first conductive type and is formed in the first well. The first top doping region is disposed between the second well and the fourth well. The second top doping region has the first conductive type and is formed in the fourth well. The first doping region and the second doping region are formed in the second top doping region.

According to an embodiment of the invention, the third doping region, the first doping region, the second doping region, the fourth doping region, and the fifth doping region form a concentric structure.

According to an embodiment of the invention, when the input/output pad receives an ESD current, the third doping region, the first doping region, and the second doping region form a BJT to expel the ESD current to the ground through the gate terminal so as to protect the internal circuit.

In an embodiment, a semiconductor structure comprises a semiconductor substrate, a first well, a second well, a third well, a fourth well, a first doping region, a second doping region, a third doping region, a fourth doping region, and a fifth doping region. The semiconductor substrate has a first conductive type. The first well has a second conductive type and is formed in the semiconductor substrate. The second well has the second conductive type and is formed in the first well. The third well has the first conductive type, is formed in the semiconductor substrate, and is adjacent to the first well. The fourth well has the first conductive type, is formed in the first well, and is disposed between the second well and the third well. The first doping region has the first conductive type and formed in the fourth well. The second doping region has the second conductive type, is formed in the fourth well, and is adjacent to the first doping region. The third doping region has the second conductive type and is formed in the second well. The fourth doping region has the second conductive type, is formed in the first well, and is disposed between the third well and the fourth well. The fifth doping region has the first conductive type and is formed in the third well. The first conductive type is different from the second conductive type.

According to an embodiment of the invention, the first doping region is disposed between the second doping region and the third doping region.

According to an embodiment of the invention, the second doping region is disposed between the first doping region and the third doping region.

According to an embodiment of the invention, the second doping region is divided into a plurality of blocks. The blocks are evenly distributed in the first doping region.

According to another embodiment of the invention, the first doping region is divided into a plurality of blocks. The blocks are evenly distributed in the second doping region.

According to an embodiment of the invention, the first doping region and the second doping region form a gate terminal of a transistor. The third doping region forms a drain terminal of the transistor. The fourth doping region forms a source terminal of the transistor. The fifth doping region forms a base terminal of the transistor.

According to an embodiment of the invention, the gate terminal and the base terminal are coupled to a ground. When the drain terminal receives an ESD current, the third doping region, the first doping region, and the second doping region form a BJT to expel the ESD current to the ground through the gate terminal so as to protect an internal circuit.

According to an embodiment of the invention, the semiconductor structure further comprises a first top doping region and a second top doping region. The first top doping region has the first conductive type and formed in the first well. The first top doping region is disposed between the second well and the fourth well. The second top doping region has the first conductive type and is formed in the fourth well. The first doping region and the second doping region are formed in the second top doping region.

According to an embodiment of the invention, the third doping region, the first doping region, the second doping region, the fourth doping region, and the fifth doping region form a concentric structure.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
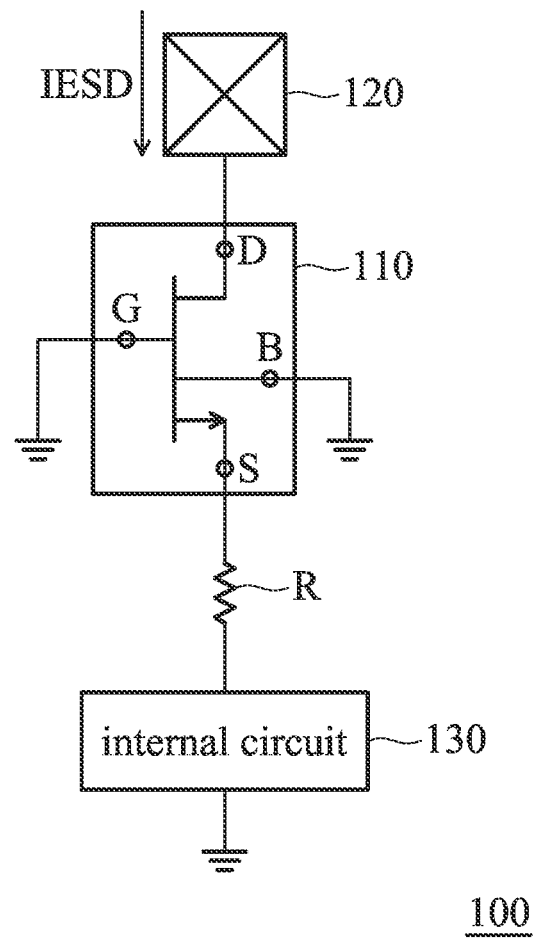
FIG. 1 is a schematic diagram of an integrated circuit in accordance with an embodiment of the invention.

The semiconductor device of the present disclosure is described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

It should be noted that the elements or devices in the drawings of the present disclosure may be present in any form or configuration known to those skilled in the art. In addition, the expression "a layer overlying another layer", "a layer is disposed above another layer", "a layer is disposed on another layer" and "a layer is disposed over another layer" may indicate that the layer is in direct contact with the other layer, or that the layer is not in direct contact with the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

The terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another region, layer or section. Thus, a first element, component, region, layer, portion or section discussed below could be termed a second element, component, region, layer, portion or section without departing from the teachings of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

This description of the exemplary embodiments is intended to be read in connection with the accompanying drawings, which are to be considered part of the entire written description. The drawings are not drawn to scale. In addition, structures and devices are shown schematically in order to simplify the drawing.

In the description, relative terms such as "lower," "upper," "horizontal," "vertical,", "above," "below," "up," "down," "top" and "bottom" as well as derivative thereof (e.g., "horizontally," "downwardly," "upwardly." etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

It should also be noted that the present disclosure presents embodiments of a semiconductor device, and may be included in an integrated circuit (IC) such as a microprocessor, memory device, and/or other device. The IC may also include various passive and active microelectronic devices, such as thin film resistors, other capacitor (e.g. metal-insulator-metal capacitor, MIMCAP), inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, or other types of transistors. One of ordinary skill may recognize that the high-voltage semiconductor devices may be used in other type of semiconductor elements.

FIG. 1 is a schematic diagram of an integrated circuit in accordance with an embodiment of the invention. As shown in FIG. 1, the integrated circuit 100 includes a transistor 110, an input/output pad 120, a resistor R, and internal circuit 130. The transistor 110 includes a gate terminal G, a source terminal S, a drain terminal D, and a base terminal B, in which the gate terminal G and the base terminal B are coupled to the ground, the drain terminal D is coupled to the input/output pad 120, and the source terminal S is coupled to the internal circuit 130 through the resistor R.

According to an embodiment of the invention, when the input/output pad 120 receives the ESD current IESD generated due to electrostatic discharge, the transistor 110 should expel the ESD current IESD so that the ESD current IESD does not flow through the internal circuit 130 to damage the internal circuit 130. According to an embodiment of the invention, the transistor 110 is a junction field effect transistor (JFET). When the transistor 110 operates normally, the gate terminal G of the transistor 110 is grounded such that the input/output pad 120 can be coupled to the internal circuit 130 and the transistor 110 does not affect the performance of the internal circuit 130.

Figure 2:
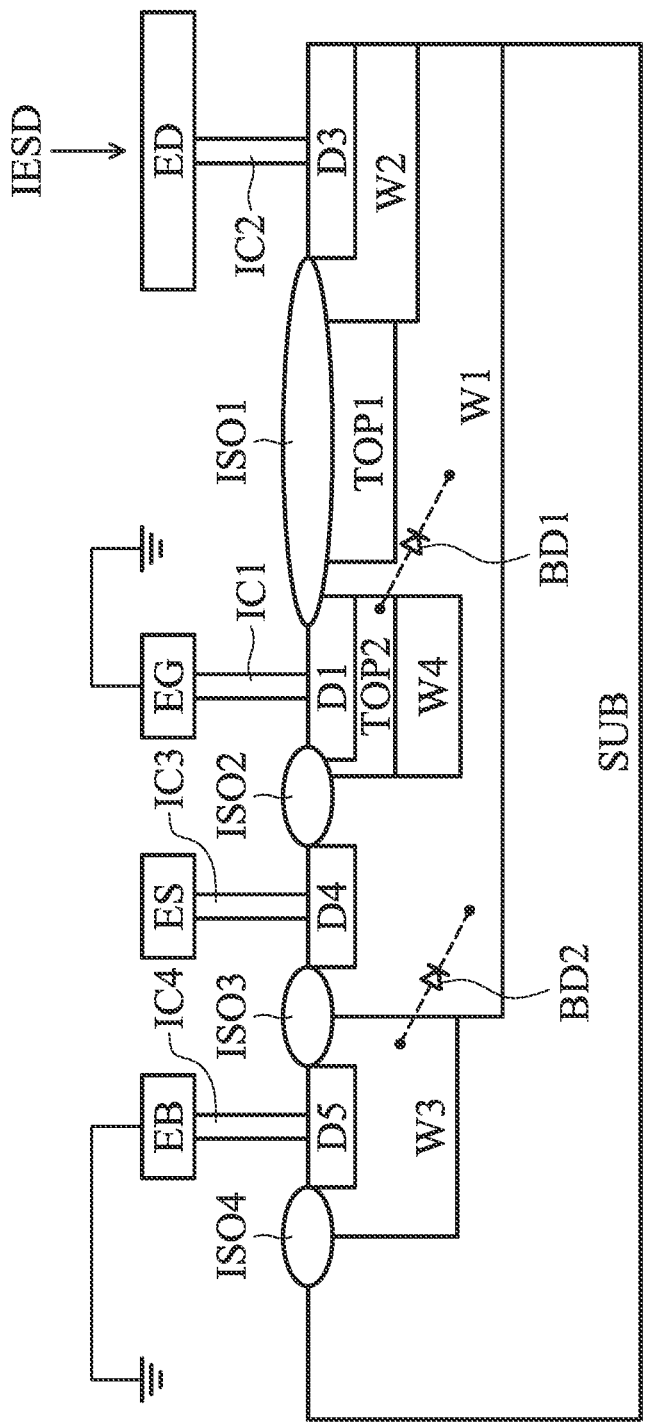
FIG. 2 is a cross-sectional view of a transistor in accordance with an embodiment of the invention.

FIG. 2 is a cross-sectional view of a transistor in accordance with an embodiment of the invention. The transistor 200 includes a semiconductor substrate SUB, a first well W1, a second well W2, a third well W3, and a fourth well W4.

The semiconductor substrate SUB has a first conductive type. According to an embodiment of the invention, the semiconductor substrate SUB is a silicon substrate. According to other embodiments of the invention, the semiconductor substrate SUB may be a light-doped semiconductor substrate having the first conductive type.

The first well W1 is formed in the semiconductor substrate SUB and has a second conductive type. According to an embodiment of the invention, the first conductive type is P-type, and the second conductive type is N-type. According to an embodiment of the invention, the first well W1 can be formed by ion implantation. For example, phosphorus ions or arsenic ions can be implanted in the predetermined area to form the first well W1.

The second well W2 is formed in the first well W1 and has the second conductive type. According to an embodiment of the invention, the second well W2 can be formed by ion implantation. For example, phosphorus ions or arsenic ions can be implanted in the predetermined area to form the second well W2.

The third well W3 is formed in the semiconductor substrate SUB and adjacent to the first well W1. The third well W3 has a first conductive type. According to an embodiment of the invention, the third well W3 can be formed by ion implantation. For example, boron ions or indium ions can be implanted in the predetermined area to form the third well W3. In the embodiment, the doping concentration of the third well W3 is higher than that of the semiconductor substrate SUB.

The fourth well W4 is formed in the first well W1 and disposed between the second well W2 and the third well W3. The fourth well W4 has the first conductive type. According to an embodiment of the invention, the fourth well W4 can be formed by ion implantation. For example, boron ions and indium ions can be implanted in the predetermined area to form the fourth well W4. In the embodiment, the doping concentration of the fourth well W4 is higher than that of the semiconductor substrate SUB.

According to an embodiment of the invention, the first conductive type is different from the second conductive type. In other words, the first well W1 and the second well W2 have the same conductive type, and the semiconductor substrate SUB, the third well W3, and the fourth well W4 have the same conductive type.

As shown in FIG. 2, the transistor 200 further includes a first top doping region TOP1 and a second top doping region TOP2. The first top doping region TOP1 is formed in the first well W1 and disposed between the second well W2 and the fourth well W4, in which the first top doping region TOP1 has the first conductive type. According to an embodiment of the invention, the first top doping region TOP1 is adjacent to the second well W2. The second top doping region TOP2 is formed in the fourth well W4 and has the first conductive type.

As shown in FIG. 2, the transistor 200 further includes a first doping region D1, a third doping region D3, a fourth doping region D4, and a fifth doping region D5. The first doping region D1 is formed in the second top doping region TOP2 and has the first conductive type. According to an embodiment of the invention, the doping concentration of the first doping region D1 is higher than that of the second top doping region TOP2 and that of the fourth well W4.

The third doping region D3 is formed in the second well W2 and has the second conductive type. According to an embodiment of the invention, the doping concentration of the third doping region D3 is higher than that of the second well W2. The fourth doping region D4 is formed in the first well W1 and has the second conductive type.

As shown in FIG. 2, the fourth doping region D4 is disposed between the third well W3 and the fourth well W4. According to an embodiment of the invention, the doping concentration of the fourth doping region D4 is higher than that of the third well W3.

The fifth doping region D5 is formed in the third well W3 and has the first conductive type. According to an embodiment of the invention, the doping concentration of the fifth doping region D5 is higher than that of the third well W3.

As shown in FIG. 2, the transistor 200 further includes a first isolation structure ISO1, a second isolation structure ISO2, a third isolation structure ISO3, and a fourth isolation structure ISO4. The first isolation structure ISO1 is disposed between the first doping region D1 and the third doping region D3, which is configured to separate the first doping region D1 from the third doping region D3.

As shown in FIG. 2, the first isolation structure ISO1 is directly contact with the first doping region D1 and the third doping region D3, but not intended to be limited thereto. According to other embodiments of the invention, the first isolation structure ISO1 is not contact with at least one of the first doping region D1 and the third doping region D3.

The second isolation structure ISO2 is disposed between the first doping region D1 and the fourth doping region D4, which is configured to separate the first doping region D1 from the fourth doping region D4. As shown in FIG. 2, the second isolation structure ISO2 is directly contact with the first doping region D1 and the fourth doping region, but not intended to be limited thereto. According to other embodiments of the invention, the second isolation structure ISO2 is not contact with at least one of the first doping region D1 and the fourth doping region D4.

The third isolation structure ISO3 is disposed between the fourth doping region D4 and the fifth doping region D5, which is configured to separate the fourth doping region D4 from the fifth doping region D5. As shown in FIG. 2, the third isolation structure ISO3 is directly contact with the fourth doping region D4 and the fifth doping region D5, but not intended to be limited thereto. According to other embodiments of the invention, the third isolation structure ISO3 is not contact with at least one of the fourth doping region D4 and the fifth doping region D5.

Figure 3:
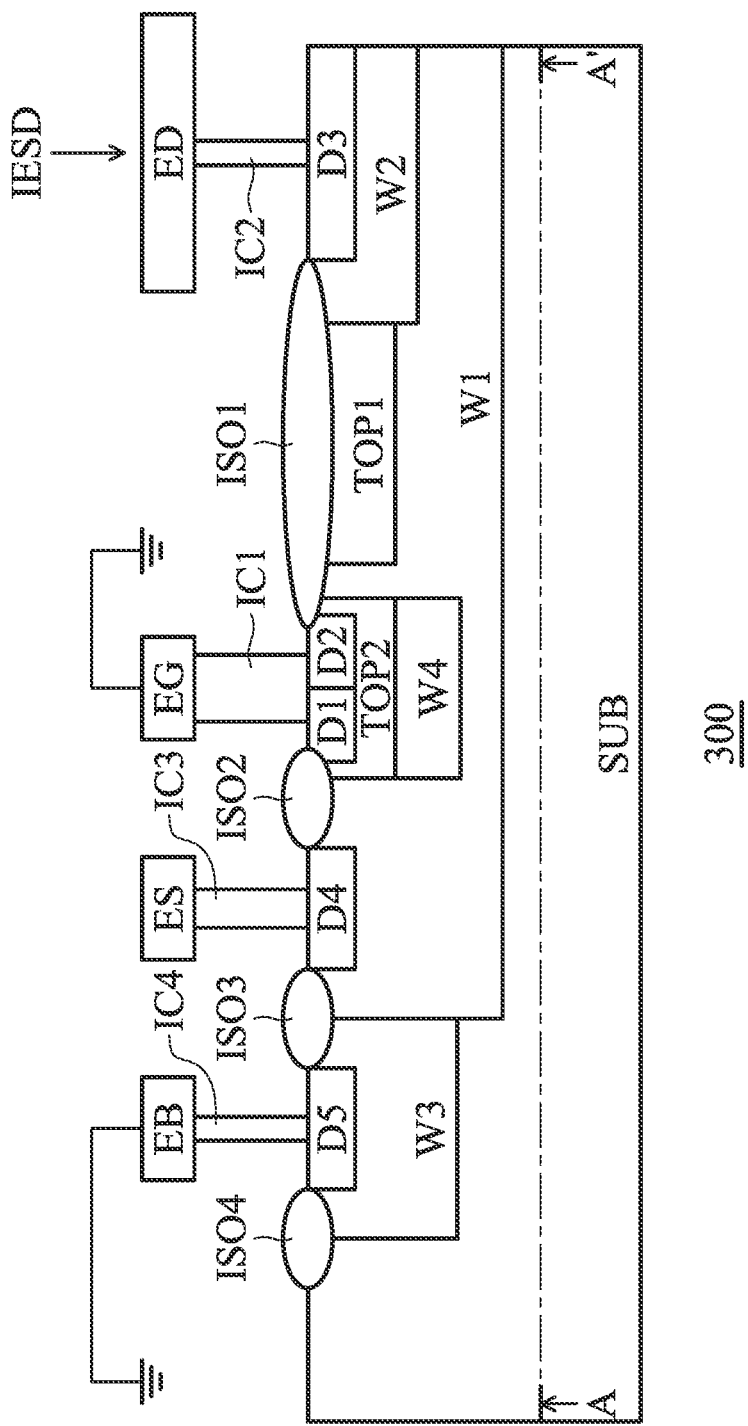
FIG. 3 is a cross-sectional view of a transistor in accordance with another embodiment of the invention.

The fourth isolation structure ISO4 is adjacent to the fifth doping region D5, which is configured to separate the fifth doping region D5 from other semiconductor structures. As shown in FIG. 3, the fourth isolation structure ISO4 is directly contact with the fifth doping region D5, but not intended to be limited thereto. According to other embodiments of the invention, the fourth isolation structure ISO4 is not contact with the fifth doping region D5.

As shown in FIG. 2, the transistor 200 further includes a first interconnect structure IC1, a second interconnect structure IC2, a third interconnect structure IC3, and a fourth interconnect structure IC4. The first interconnect structure IC1 is configured to electrically connect the first doping region D1 to the gate electrode EG, in which the gate electrode EG corresponds to the gate terminal G of the transistor 110 in FIG. 1. As shown in FIG. 2, the gate electrode EG is coupled to the ground.

The second interconnect structure IC2 is configured to electrically connect the third doping region D3 to the drain electrode ED, in which the drain electrode ED corresponds to the drain terminal D of the transistor 110 in FIG. 1. In other words, the drain electrode ED is coupled to the input/output pad 120 in FIG. 1. The third interconnect structure IC3 is configured to electrically connect the fourth doping region D4 to the source electrode ES, in which the source electrode ES corresponds to the source terminal S of the transistor 110 in FIG. 1. In other words, the source electrode ES is coupled to the internal circuit 130 through the resistor R in FIG. 1.

The fourth interconnect structure IC4 is configured to electrically connect the fifth doping region D5 to the base electrode EB, in which the base electrode EB corresponds to the base terminal B of the transistor 110 in FIG. 1. In other words, the base electrode EB is coupled to the ground.

According to an embodiment of the invention, the gate electrode EG, the drain electrode ED, the source electrode ES, and the base electrode EB can be implemented by identical or different metal layer(s).

According to an embodiment of the invention, when the transistor 110 in FIG. 1 receives the ESD current IESD through the input/output pad 120 due to electrostatic discharge, the ESD current IESD flows to the ground through a first parasitic diode BD1 and/or a second parasitic diode BD2 of the transistor 200.

As shown in FIG. 2, the first parasitic diode BD1 is formed by the junction of the first well W1 and the fourth well W4. The second parasitic diode BD2 is formed by the junction of the first well W1 and the third well W3 or the junction of the first well W1 and the semiconductor substrate SUB. According to an embodiment of the invention, when the first parasitic diode BD1 is turned on, the ESD current IESD flows to the ground through the drain electrode ED and the gate electrode EG. According to another embodiment of the invention, when the second parasitic diode BD2 is turned on, the ESD current IESD flows to the ground through the drain electrode ED and the base electrode EB.

According to some embodiments of the invention, during electrostatic discharge, a voltage across the drain electrode ED and the gate electrode EG in FIG. 2 may be too high to breakdown the first parasitic diode BD1 so as to damage the transistor 200. In order to improve the tolerance of the transistor 200, the electrostatic tolerance of the transistor 200 should be improved.

FIG. 3 is a cross-sectional view of a transistor in accordance with another embodiment of the invention. Compared the transistor 300 in FIG. 3 with the transistor 200 in FIG. 2, the transistor 300 further includes a second doping region D2. As shown in FIG. 3, the second doping region D2 is formed in the second top doping region TOP2 and adjacent to the first doping region D1. The second doping region D2 has the second conductive type. As shown in FIG. 3, the second doping region D2 is disposed between the first doping region D1 and the third doping region D3.

As shown in FIG. 3, the first interconnect structure IC1 electrically connects the first doping region D1 and the second doping region D2 to the electrode EG, and the gate electrode EG is coupled to the ground. According to an embodiment of the invention, when the first conductive type is P-type and the second conductive type is N-type, the first doping region D1, the second doping region D2, and the third doping region D3 form a parasitic BJT.

According to an embodiment of the invention, when the drain electrode ED receives the ESD current IESD, the parasitic BJT formed by the first doping region D1, the second doping region D2, and the third doping region D3 is turned on such that the ESD current IESD is expelled to the ground through the gate electrode EG so as to protect the transistor 300.

Figure 4:
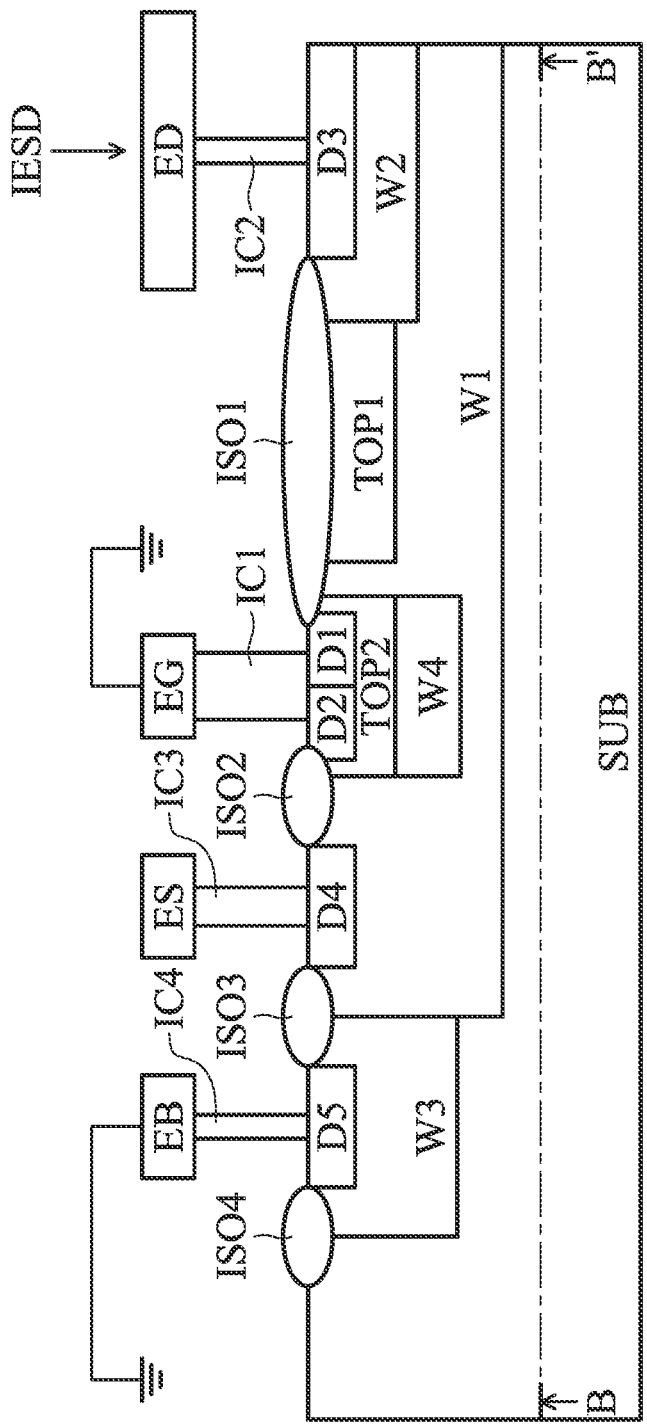
FIG. 4 is a cross-sectional view of a transistor in accordance with another embodiment of the invention.

FIG. 4 is a cross-sectional view of a transistor in accordance with another embodiment of the invention. Compared the transistor 400 in FIG. 4 with the transistor 300 in FIG. 3, the first doping region D1 of the transistor 400 is disposed between the second doping region D2 and the third doping region D3, in which the first doping region D1, the second doping region D2, and the third doping region D3 form a parasitic BJT. According to an embodiment of the invention, the current gain of the transistor 300 in FIG. 3 is higher than that of the transistor 400 in FIG. 4, in which the current gain is a ratio of the collector current to the base current of a BJT.

Figure 5:
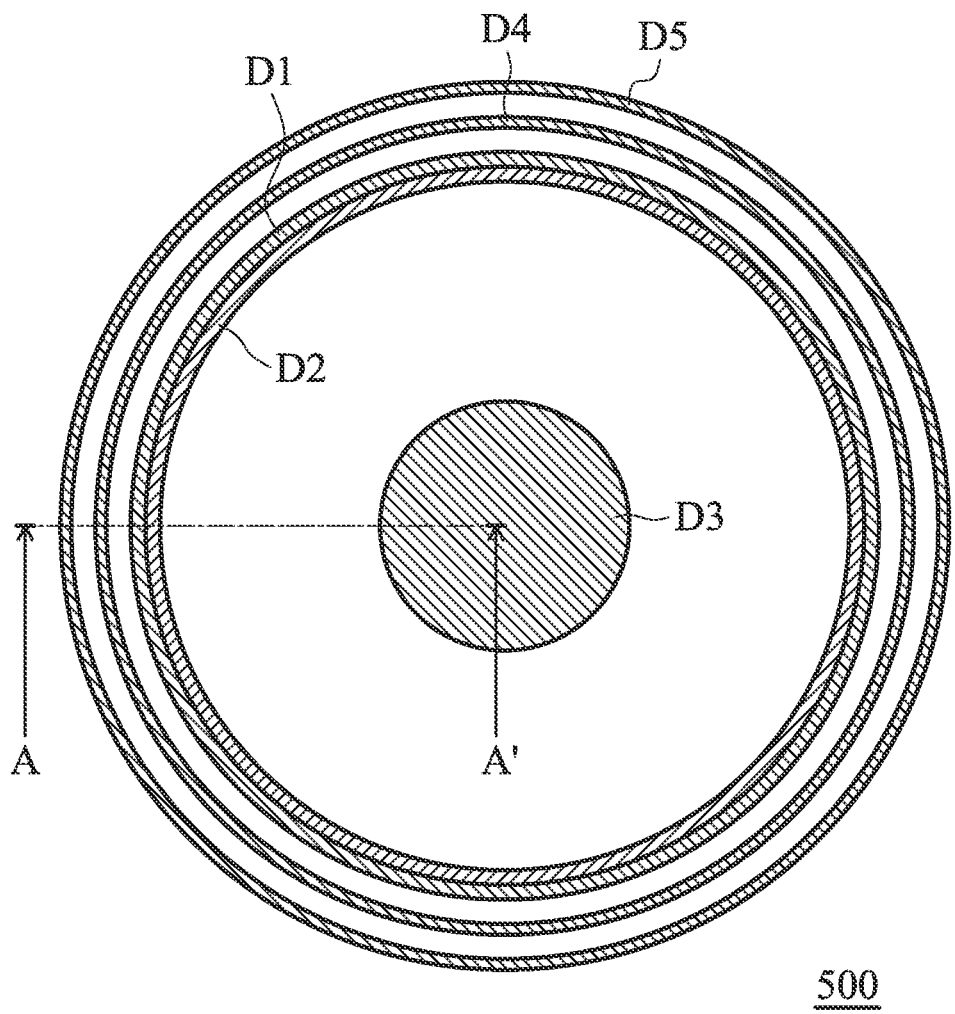
FIG. 5 is a top view of a transistor in accordance with an embodiment of the invention.

FIG. 5 is a top view of a transistor in accordance with an embodiment of the invention, in which the transistor 500 in FIG. 5 is a cross-sectional view along the dotted line from point A to point A' shown in FIG. 3. As shown in FIG. 5, the third doping region D3 of the transistor 500 corresponds to the third doping region D3 in FIG. 3, the second doping region D2 of the transistor 500 corresponds to the second doping region D2 in FIG. 3, the first doping region D1 of the transistor 500 corresponds to the first doping region D1 in FIG. 3, the fourth doping region D4 of the transistor 500 corresponds to the fourth doping region D4 in FIG. 3, and the fifth doping region D5 of the transistor 500 corresponds to the fifth doping region D5 in FIG. 3.

In other words, the first doping region D1, the second doping region D2, the third doping region D3, the fourth doping region D4, and the fifth doping region D5 of the transistor 500 form a concentric structure with the third doping region D3 as the center. The arrangement of the first doping region D1, the second doping region D2, the third doping region D3, the fourth doping region D4, and the fifth doping region D5 of the transistor 500 is shown in FIG. 3.

Figure 6:
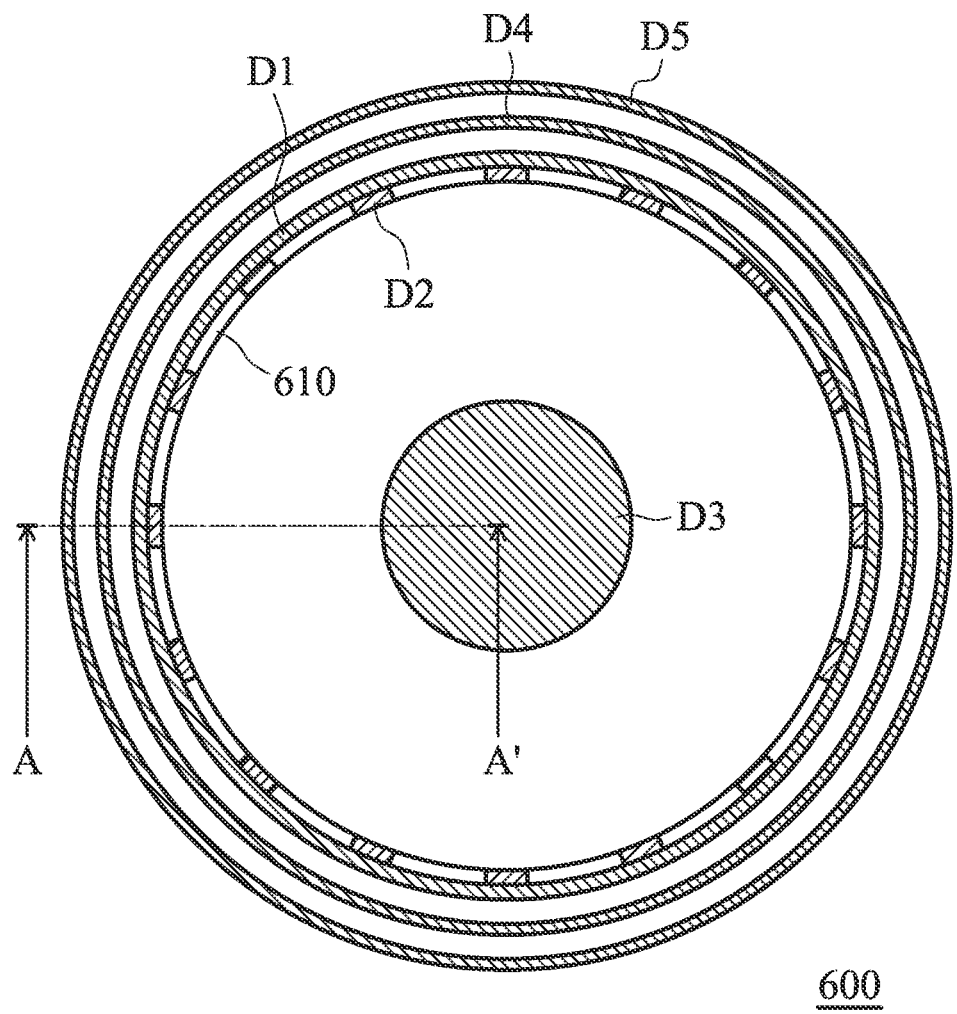
FIG. 6 is a top view of a transistor in accordance with another embodiment of the invention.

FIG. 6 is a top view of a transistor in accordance with another embodiment of the invention. The transistor 600 in FIG. 6 is a cross-sectional view along the dotted line from the point A to the point A' in FIG. 3. Compared to the second doping region D2 of the transistor 500 in FIG. 5 being formed a full circle, the second doping region D2 of the transistor 600 is formed in part of the area 610. Each of the second doping region D2 is separated by a predetermined spacing.

Figure 7:
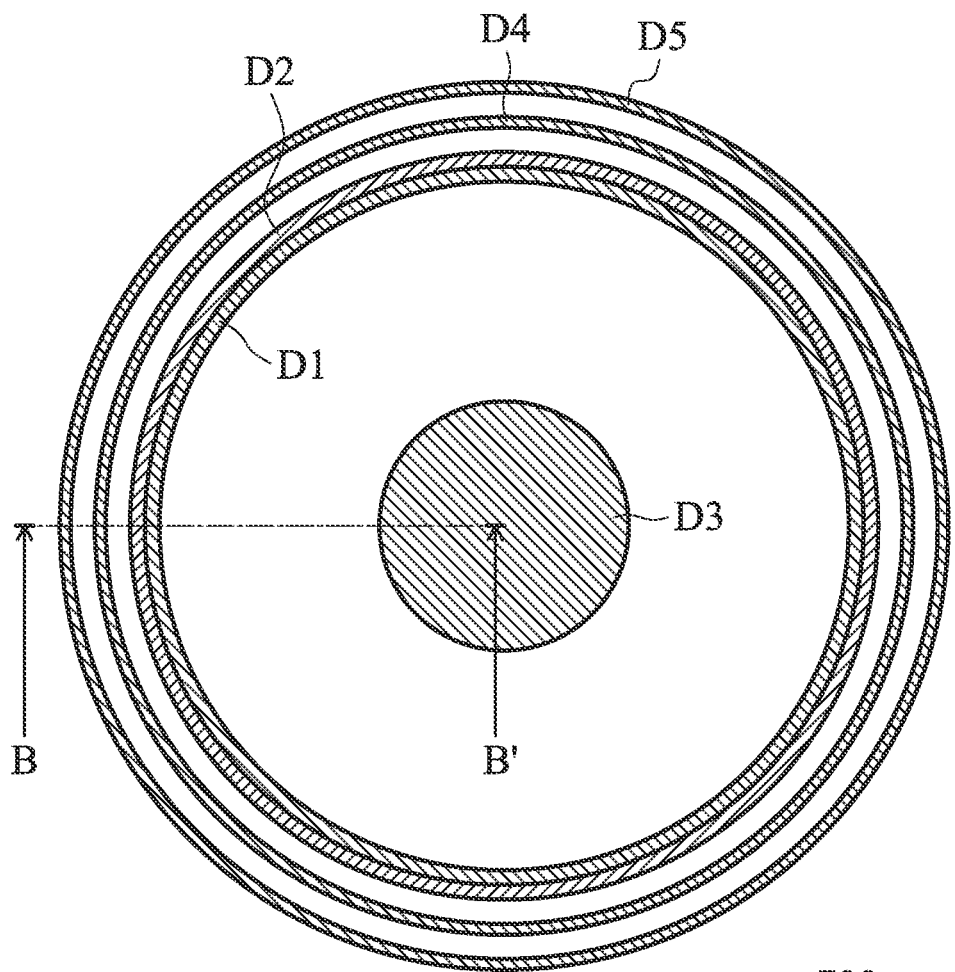
FIG. 7 is a top view of a transistor in accordance with an embodiment of the invention.

FIG. 7 is a top view of a transistor in accordance with an embodiment of the invention, in which the transistor 700 in FIG. 7 is a cross-sectional view along the dotted line from the point B to the point B' in FIG. 4. As shown in FIG. 7, the third doping region D3 of the transistor 700 corresponds to the third doping region D3 in FIG. 4, the second doping region D2 of the transistor 700 corresponds to the second doping region D2 in FIG. 4, the first doping region D1 of the transistor 700 corresponds to the first doping region D1 in FIG. 4, the fourth doping region D4 of the transistor 700 corresponds to the first doping region D1 in FIG. 4, and the fifth doping region D5 of the transistor 700 corresponds to the fifth doping region D5 in FIG. 4.)

In other words, the first doping region D1, the second doping region D2, the third doping region D3, the fourth doping region D4, and the fifth doping region D5 of the transistor 700 form a concentric structure with the third doping region D3 as the center. The arrangement of the first doping region D1, the second doping region D2, the third doping region D3, the fourth doping region D4, and the fifth doping region D5 of the transistor 700 is shown in FIG. 4.

Figure 8:
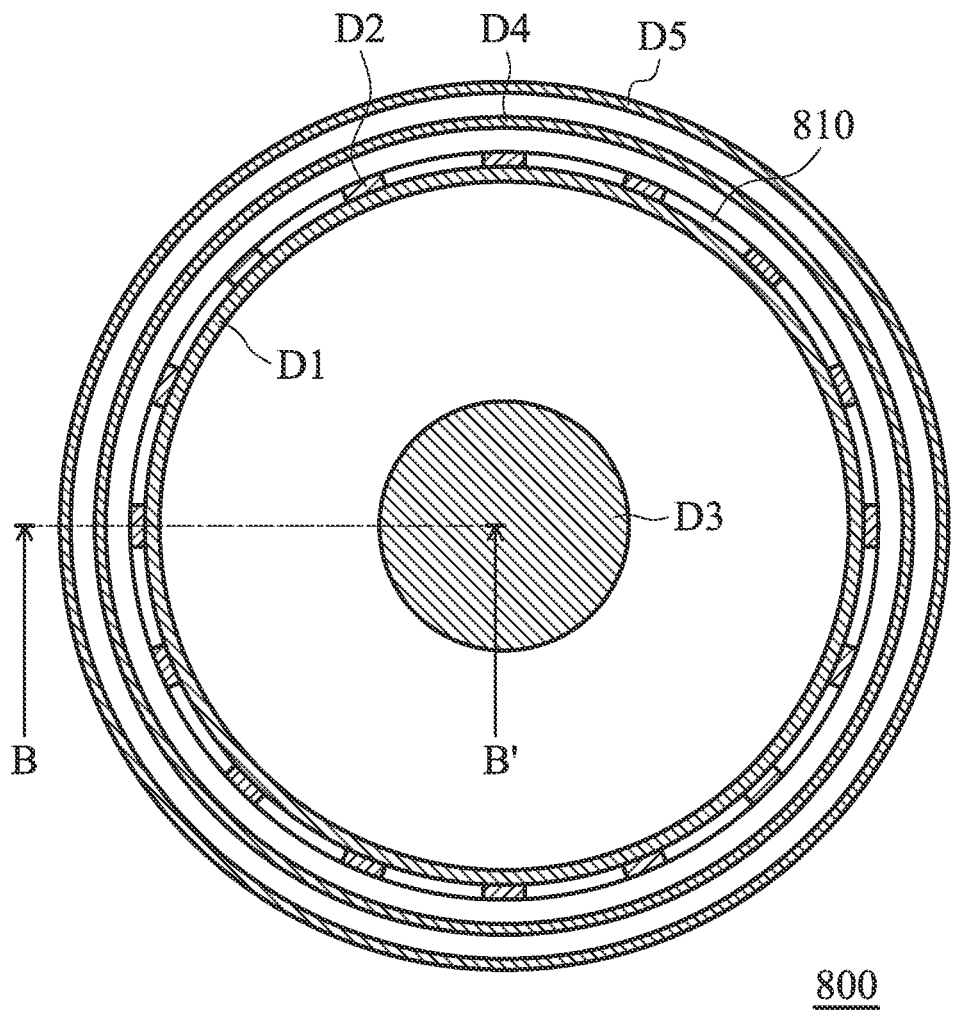
FIG. 8 is a top view of a transistor in accordance with another embodiment of the invention.

FIG. 8 is a top view of a transistor in accordance with another embodiment of the invention, in which the transistor 800 in FIG. 8 is as cross-sectional view along the dotted line from the point B to the point B' in FIG. 4. Compared to the second doping region D2 of the transistor 700 in FIG. 7 being formed a full circle, the second doping region D2 of the transistor 800 is formed in part of the area 810. Each of the second doping region D2 is separated by a predetermined spacing.

Figure 9:
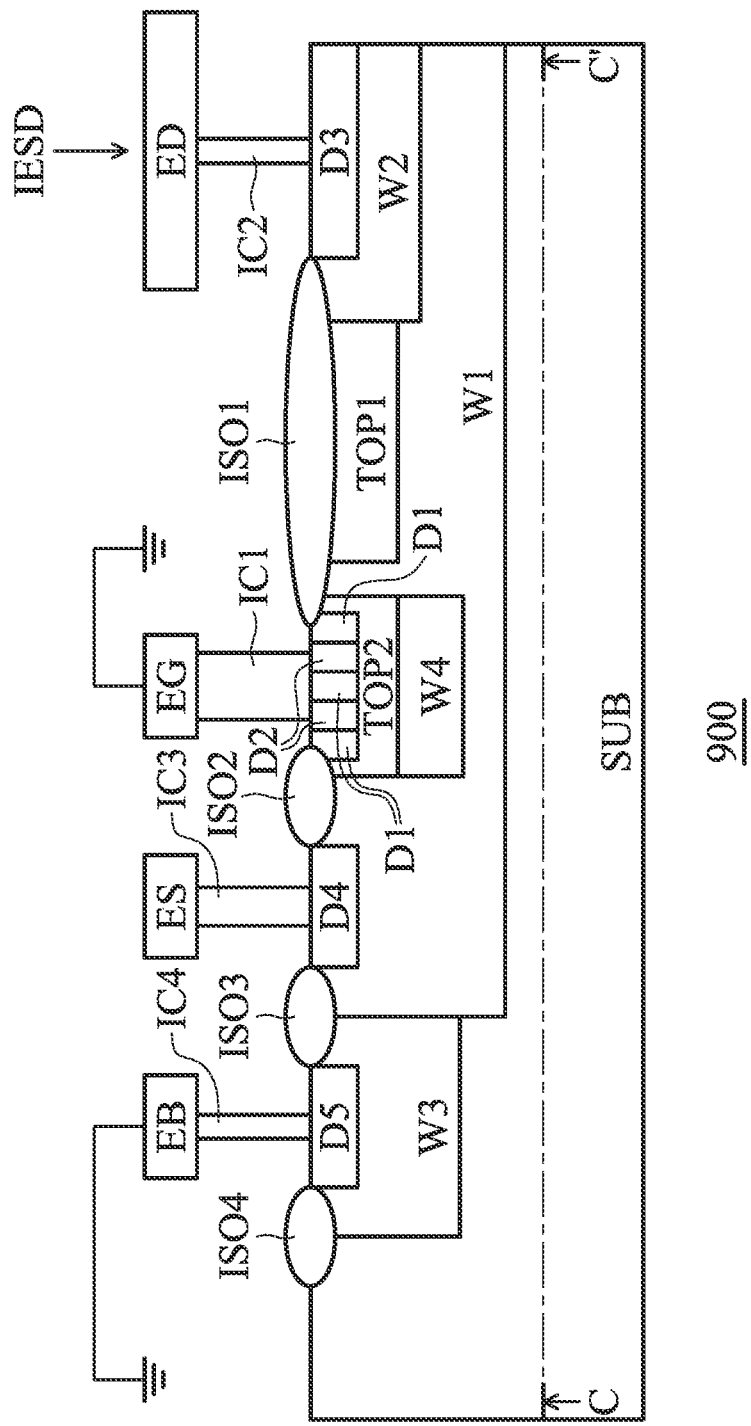
FIG. 9 is a cross-sectional view of a transistor in accordance with an embodiment of the invention.

FIG. 9 is a cross-sectional view of a transistor in accordance with another embodiment of the invention. Compared the transistor 900 in FIG. 9 with the transistor 200 in FIG. 2, the second doping region D2 of the transistor 900 is evenly distributed in the first doping region D1. The second doping region D2 has the second conductive type. The first doping region D1, the second doping region D2, and the third doping region D3 form a parasitic BJT.

Figure 10:
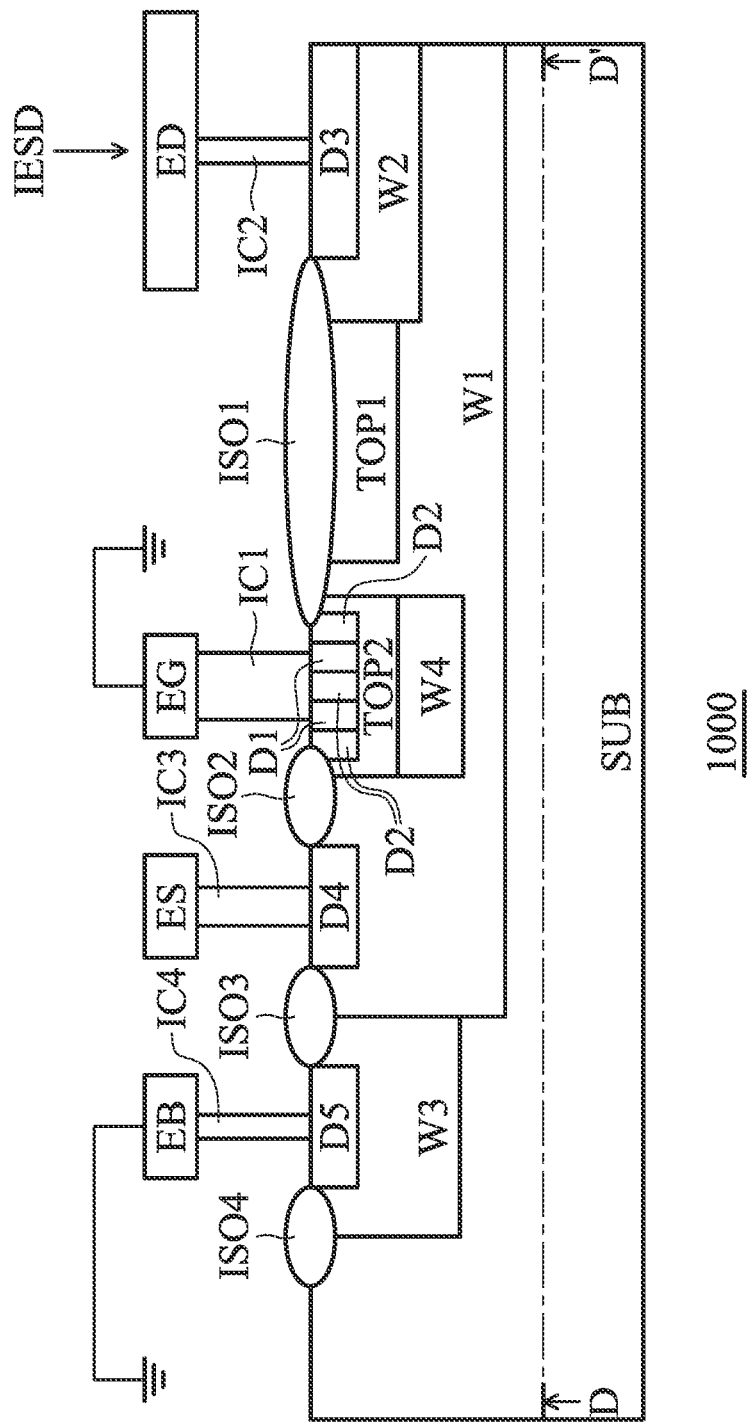
FIG. 10 is a cross-sectional view of a transistor in accordance with another embodiment of the invention.

FIG. 10 is a cross-sectional view of a transistor in accordance with another embodiment of the invention. Compared the transistor 1000 in FIG. 10 with the transistor 200 in FIG. 2, the second doping region D2 of the transistor 1000 is formed in the second top doping region TOP2 and has the second conductive type. In addition, the first doping region D1 of the transistor 1000 in FIG. 10 is evenly distributed in the second doping region D2, in which the first doping region D1, the second doping region D2, and the third doping region D3 is formed in a parasitic BJT.

Figure 11:
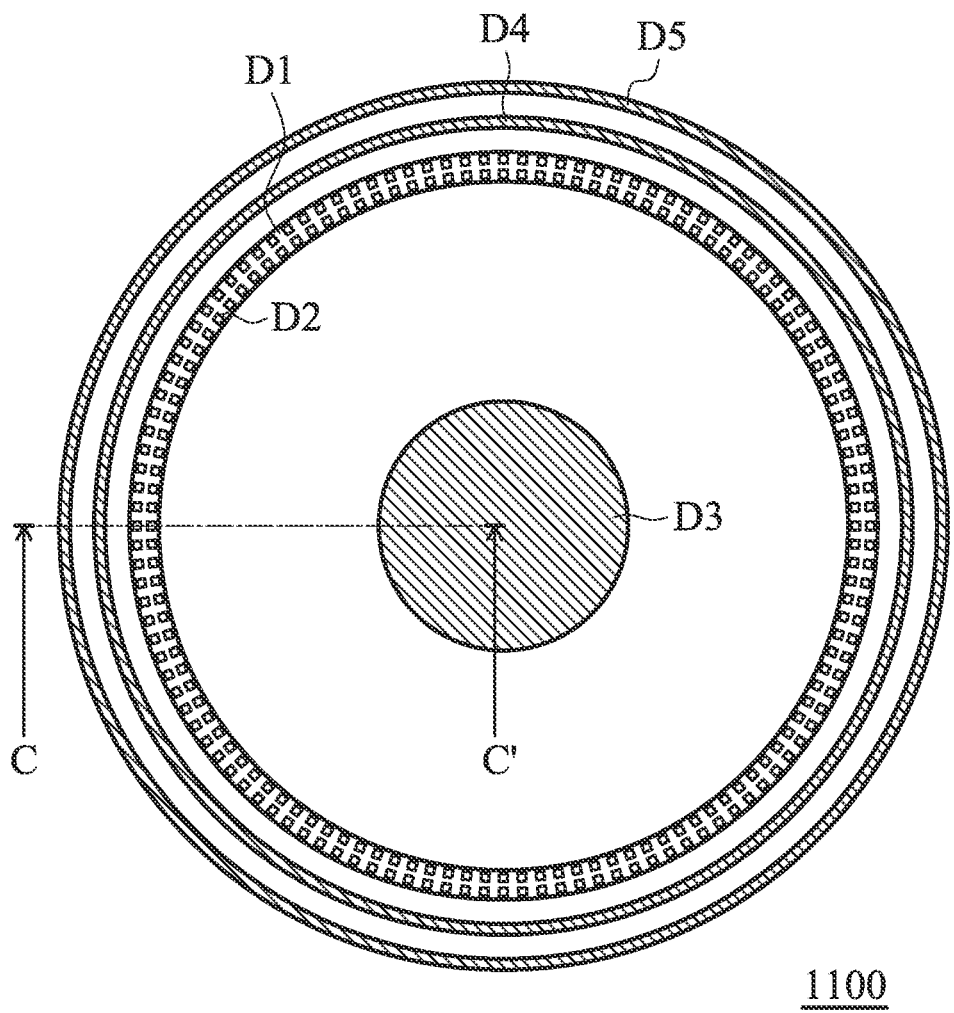
FIG. 11 is a top view of a transistor in accordance with an embodiment of the invention.

FIG. 11 is a top view of a transistor in accordance with an embodiment of the invention, in which the transistor 1100 in FIG. 11 is a cross-sectional view along the dotted line from the point C to the point C' in FIG. 9. As shown in FIG. 11, the second doping region D2 of the transistor 1100 is divided into a plurality of blocks and the blocks are evenly distributed in the first doping region D1.

As shown in FIG. 11, the third doping region D3 of the transistor 1100 corresponds to the third doping region D3 in FIG. 9, the second doping region D2 of the transistor 1100 corresponds to the second doping region D2 in FIG. 9, the first doping region D1 of the transistor 1100 corresponds to the first doping region D1 in FIG. 9, the fourth doping region D4 of the transistor 1100 corresponds to the fourth doping region D4 in FIG. 9, and the fifth doping region D5 of the transistor 1100 corresponds to the fifth doping region D5 in FIG. 9.

Figure 12:
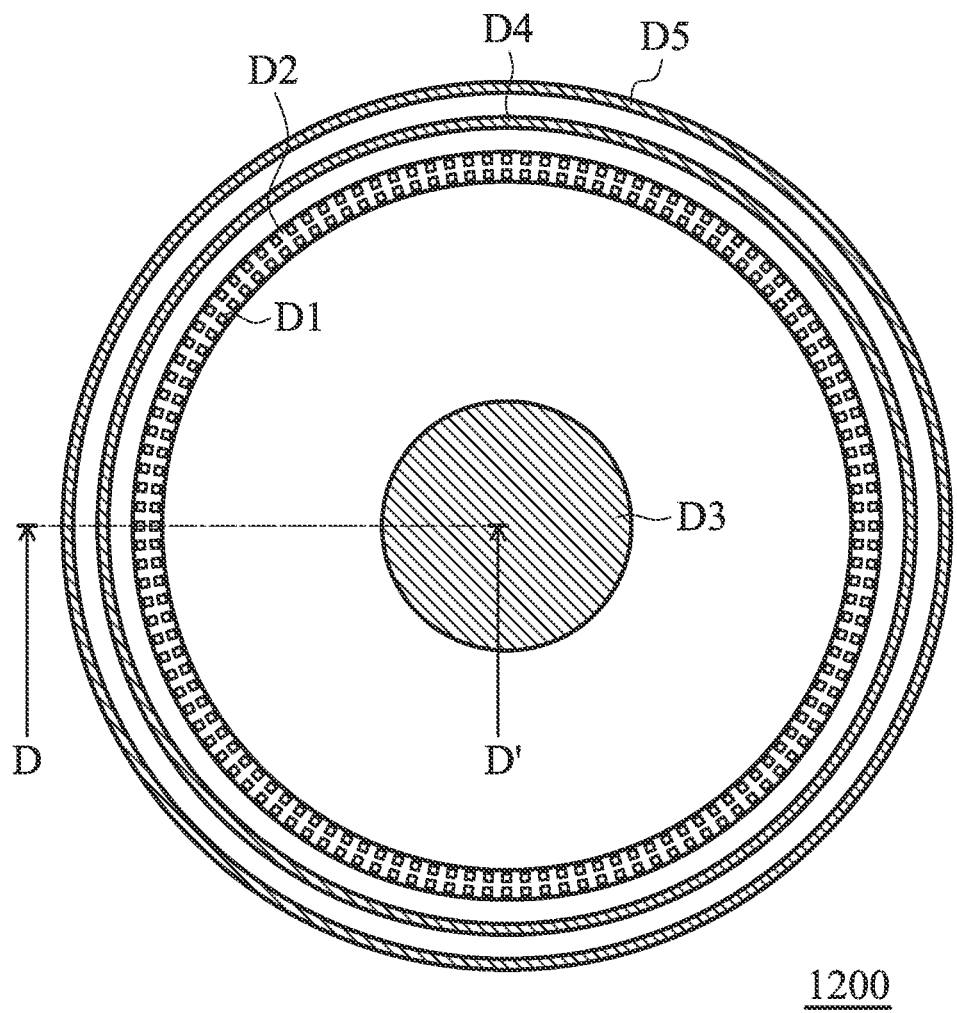
FIG. 12 is a top view of a transistor in accordance with another embodiment of the invention.

FIG. 12 is a top view of a transistor in accordance with another embodiment of the invention, in which the transistor 1200 in FIG. 12 is a cross-sectional view along the dotted line from the point D to the point D' in FIG. 10. As shown in FIG. 12, the first doping region D1 of the transistor 1200 is divided into a plurality of blocks and the blocks are evenly distributed in the second doping region D2.

As shown in FIG. 12, the third doping region D3 of the transistor 1200 corresponds to the third doping region D3 in FIG. 10, the second doping region D2 of the transistor 1200 corresponds to the second doping region D2 in FIG. 10, the first doping region D1 of the transistor 1200 corresponds to the first doping region D1 in FIG. 10, the fourth doping region D4 of the transistor 1200 corresponds to the fourth doping region D4 in FIG. 10, and the fifth doping region D5 of the transistor 1200 corresponds to the fifth doping region D5 in FIG. 10.

Transistors with ESD protection are provided herein. The ESD protection ability of a transistor can be improved by incorporating an additional doping region into the gate terminal without increasing the circuit area of the transistor, additional manufacturing process, and interfering performance.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device for protecting an internal circuit, comprising:
   a transistor, comprising a gate terminal, a source terminal, and a drain terminal, wherein the gate terminal is coupled to a ground, the source terminal is coupled to the internal circuit, and the drain terminal is coupled to an input/output pad, wherein when the input/output pad receives an ESD current generated due to electrostatic discharge, the transistor expels the ESD current so that the ESD current IESD does not flow through the internal circuit to damage the internal circuit;
   a first doping region, having a first conductive type; and
   a second doping region, having a second conductive type, wherein the first doping region is adjacent to the second doping region, wherein a first interconnect structure electrically connects the first doping region and the second doping region to a gate electrode, wherein the first conductive type is different from the second conductive type.

2. The semiconductor device of claim 1, further comprising:
   a semiconductor substrate, having the first conductive type;
   a first well, having the second conductive type and formed in the semiconductor substrate;
   a second well, having the second conductive type and formed in the first well;
   a third well, having the first conductive type, formed in the semiconductor substrate, and adjacent to the first well; and
   a fourth well, having the first conductive type, formed in the first well, and disposed between the second well and the third well, wherein the first doping region and the second doping region are formed in the fourth well.

3. The semiconductor device of claim 2, further comprising:
   a third doping region, having the second conductive type and formed in the second well;
   a fourth doping region, having the second conductive type, formed in the first well, and disposed between the third well and the fourth well; and a fifth doping region, having the first conductive type and formed in the third well.

4. The semiconductor device of claim 3, wherein the first doping region is disposed between the second doping region and the third doping region.

5. The semiconductor device of claim 3, wherein the second doping region is disposed between the first doping region and the third doping region.

6. The semiconductor device of claim 3, wherein the second doping region is divided into a plurality of blocks, wherein the blocks are evenly distributed in the first doping region.

7. The semiconductor device of claim 3, wherein the first doping region is divided into a plurality of blocks, wherein the blocks are evenly distributed in the second doping region.

8. The semiconductor device of claim 3, wherein the base terminal is coupled to the ground.

9. The semiconductor device of claim 3, further comprising:
   a first top doping region, having the first conductive type and formed in the first well, wherein the first top doping region is disposed between the second well and the fourth well; and
   a second top doping region, having the first conductive type and formed in the fourth well, wherein the first doping region and the second doping region are formed in the second top doping region.

10. The semiconductor device of claim 9, wherein the third doping region, the first doping region, the second doping region, the fourth doping region, and the fifth doping region form a concentric structure.

11. The semiconductor device of claim 9, wherein when the input/output pad receives an ESD current, the third doping region, the first doping region, and the second doping region form a BJT to expel the ESD current to the ground through the gate terminal so as to protect the internal circuit.

12. A semiconductor structure comprising a semiconductor substrate having a first conductive type, comprising:
   a first well, having a second conductive type and formed in the semiconductor substrate;
   a second well, having the second conductive type and formed in the first well;
   a third well, having the first conductive type, formed in the semiconductor substrate, and adjacent to the first well, wherein the third well is in contact with the semiconductor substrate;
   a fourth well, having the first conductive type, formed in the first well, and disposed between the second well and the third well;
   a first doping region, having the first conductive type and formed in the fourth well;
   a second doping region, having the second conductive type, formed in the fourth well, and adjacent to the first doping region;
   a third doping region, having the second conductive type and formed in the second well;
   a fourth doping region, having the second conductive type, formed in the first well, and disposed between the third well and the fourth well; and
   a fifth doping region, having the first conductive type and formed in the third well,
   wherein the first conductive type is different from the second conductive type, wherein the first doping region, the second doping region, and the fifth doping region are coupled to a ground, the third doping region is coupled to an input/output pad, and the fourth doping region is coupled to an internal circuit, and wherein the semiconductor structure is configured to protect the internal circuit from ESD stress of the input/output pad.

13. The semiconductor structure of claim 12, wherein the first doping region is disposed between the second doping region and the third doping region.

14. The semiconductor structure of claim 12, wherein the second doping region is disposed between the first doping region and the third doping region.

15. The semiconductor structure of claim 12, wherein the second doping region is divided into a plurality of blocks, wherein the blocks are evenly distributed in the first doping region.

16. The semiconductor structure of claim 12, wherein the first doping region is divided into a plurality of blocks, wherein the blocks are evenly distributed in the second doping region.

17. The semiconductor structure of claim 12, wherein a first interconnect structure electrically connects the first doping region and the second doping region to a gate electrode of a transistor.

18. The semiconductor structure of claim 17, wherein the gate terminal and the base terminal are coupled to the ground, wherein when the drain terminal receives an ESD current from the input/output pad, the third doping region, the first doping region, and the second doping region form a BJT to expel the ESD current to the ground through the gate terminal so as to protect the internal circuit.

19. The semiconductor structure of claim 12, further comprising:
 a first top doping region, having the first conductive type and formed in the first well, wherein the first top doping region is disposed between the second well and the fourth well; and
 a second top doping region, having the first conductive type and formed in the fourth well, wherein the first doping region and the second doping region are formed in the second top doping region.

20. The semiconductor structure of claim 12, wherein the third doping region, the first doping region, the second doping region, the fourth doping region, and the fifth doping region form a concentric structure.

* * * * *